United States Patent
Jeong et al.

(10) Patent No.: US 10,884,335 B2
(45) Date of Patent: Jan. 5, 2021

(54) BLACK PHOTOSENSITIVE RESIN COMPOSITION AND BLACK COLUMN SPACER PREPARED THEREFROM

(71) Applicant: Rohm and Haas Electronic Materials Korea Ltd., Cheonan (KR)

(72) Inventors: Hyung Gu Jeong, Busan (KR); Seok-Bong Park, Yongin (KR); Ji Ung Kim, Hwaseong (KR)

(73) Assignee: Rohm and Haas Electronic Materials Korea Ltd., Seoul (KR)

( * ) Notice: Subject to any disclaimer, the term of this patent is extended or adjusted under 35 U.S.C. 154(b) by 57 days.

(21) Appl. No.: 16/066,475

(22) PCT Filed: Nov. 21, 2016

(86) PCT No.: PCT/KR2016/013396
§ 371 (c)(1),
(2) Date: Jun. 27, 2018

(87) PCT Pub. No.: WO2017/126795
PCT Pub. Date: Jul. 27, 2017

(65) Prior Publication Data
US 2019/0018318 A1    Jan. 17, 2019

(30) Foreign Application Priority Data

Jan. 18, 2016  (KR) .................. 10-2016-0006040
Nov. 18, 2016  (KR) .................. 10-2016-0154303

(51) Int. Cl.
| | | |
|---|---|---|
| G03F 7/033 | (2006.01) | |
| G03F 7/031 | (2006.01) | |
| G03F 7/021 | (2006.01) | |
| G03F 7/105 | (2006.01) | |
| C08L 33/08 | (2006.01) | |
| C08L 33/10 | (2006.01) | |
| C08L 63/00 | (2006.01) | |
| C08F 2/48 | (2006.01) | |
| C08G 65/00 | (2006.01) | |
| C08G 59/00 | (2006.01) | |
| C08L 71/00 | (2006.01) | |
| G03F 7/038 | (2006.01) | |
| G03F 7/027 | (2006.01) | |
| C08K 5/23 | (2006.01) | |
| C08K 3/04 | (2006.01) | |
| C08K 3/013 | (2018.01) | |
| C08K 5/00 | (2006.01) | |
| G03F 7/00 | (2006.01) | |

(52) U.S. Cl.
CPC ............... *G03F 7/033* (2013.01); *C08F 2/48* (2013.01); *C08G 59/00* (2013.01); *C08G 65/00* (2013.01); *C08L 33/08* (2013.01); *C08L 33/10* (2013.01); *C08L 63/00* (2013.01); *C08L 71/00* (2013.01); *G03F 7/027* (2013.01); *G03F 7/0217* (2013.01); *G03F 7/031* (2013.01); *G03F 7/038* (2013.01); *G03F 7/0388* (2013.01); *G03F 7/105* (2013.01); *C08K 3/013* (2018.01); *C08K 3/04* (2013.01); *C08K 5/0041* (2013.01); *C08K 5/235* (2013.01); *C08L 2203/16* (2013.01); *G03F 7/0007* (2013.01)

(58) Field of Classification Search
CPC ........ G03F 7/0007; G03F 7/031; G03F 7/033; G03F 7/038; G03F 7/0388; G03F 7/0385; C08L 33/02; C08L 33/10; C08L 33/08; C08L 63/00; C08L 63/10; G02F 1/133512; G02F 1/13394; G02F 2001/13398
USPC .......... 430/7, 320, 321, 281.1, 287.1, 280.1; 349/110, 156
See application file for complete search history.

(56) References Cited

U.S. PATENT DOCUMENTS

| | | |
|---|---|---|
| 2015/0226892 A1 | 8/2015 | Liao et al. |
| 2016/0282528 A1 * | 9/2016 | Yu .................. G02F 1/133512 |

FOREIGN PATENT DOCUMENTS

| | | | |
|---|---|---|---|
| JP | 2001-154206 A | | 6/2001 |
| JP | 2010-237488 A | | 10/2010 |
| JP | 2014-235376 A | * | 12/2014 |
| JP | 2015-084086 A | | 4/2015 |
| KR | 2000-0035753 A | | 6/2000 |
| KR | 2007-0036816 A | | 4/2007 |
| KR | 10-0814660 B1 | | 3/2008 |
| KR | 2014-0096423 A | | 8/2014 |
| WO | WO 2017/110893 A1 | * | 6/2017 |

OTHER PUBLICATIONS

Computer-generated translation of JP 2014-235376 (Dec. 2014). (Year: 2014).*
Computer-generated translation of WO 2017/110893 (Jun. 2017) (Year: 2017).*

* cited by examiner

*Primary Examiner* — John A McPherson
(74) *Attorney, Agent, or Firm* — S. Matthew Cairns

(57) ABSTRACT

Disclosed herein are a black photosensitive resin composition and a black column spacer prepared therefrom. The black photosensitive resin composition may form a cured film exhibiting good adhesion to a substrate, good height difference property, good surface roughness and high light shielding property (optical density), and may be effectively used for the formation of a cured film, particularly a black column spacer, of a liquid crystal display (LCD) or an organic light-emitting diode (OLED) display.

5 Claims, 1 Drawing Sheet

BLACK PHOTOSENSITIVE RESIN COMPOSITION AND BLACK COLUMN SPACER PREPARED THEREFROM

TECHNICAL FIELD

The present invention relates to a black photosensitive resin composition and a black column spacer prepared therefrom, in particular, a black photosensitive resin composition which is appropriate as a material for the formation of a spacer, a light shielding part, etc., which are used in a panel of a liquid crystal display (LCD) or an organic light-emitting diode (OLED) display, and a cured film, particularly, a black column spacer (BCS) prepared therefrom.

BACKGROUND ART

Recently, in a liquid crystal cell of an LCD, a spacer formed using a photosensitive resin composition is employed to maintain a constant distance between upper and lower transparent substrates. In an LCD, an electro-optic device driven by a voltage applied to a liquid crystal material injected into a constant gap between two transparent substrates, it is very crucial to maintain the gap between the two substrates even. If the gap between the transparent substrates is not constant, the voltage applied thereto as well as the transmittance of light penetrating this area may vary, resulting in defects of spatially non-uniform luminance. According to a recent demand for large LCD panels in size, it is even more crucial to maintain a constant gap between two transparent substrates.

A spacer may be formed by coating a photosensitive resin composition onto a substrate and exposing the coated substrate to ultraviolet light, etc., using a mask, followed by development thereof. Recently, efforts of using a light shielding material for a spacer have been made; accordingly, various colored photosensitive resin compositions have been actively developed.

In this regard, a variety of black photosensitive resin compositions for forming a black column spacer have been disclosed (see Japanese Laid-open Publication No. 2001-154206, Korean Patent No. 10-0814660, and Korean Laid-open Publication No. 2000-0035753).

In order to impart high light shielding property, the content of a pigment added to a resin composition is required to be increased. However, in such case, a cured film having deteriorated adhesion to a substrate, surface roughness and height difference property may be formed. Korean Patent No. 10-0814660 discloses a method of using a black organic pigment having good light shielding property and low dielectric constant. However, when a black organic pigment is used, a large amount of black organic pigment is required in comparison with carbon black to accomplish high optical density.

Accordingly, researches on a black photosensitive resin composition which satisfies all properties including adhesion, height difference property, surface roughness, and light shielding property of a cured film in an LCD or OLED display, which are particularly required in a black column spacer having height difference, are eagerly required.

DISCLOSURE OF INVENTION

Technical Problem

An object of the present invention is to provide a black photosensitive resin composition which may produce a cured film that satisfies good adhesion, surface roughness and high light shielding property (optical density), particularly a black column spacer having good height difference property, and a cured film prepared therefrom.

Solution to Problem

According to one aspect of the present invention, there is provided a black photosensitive resin composition, which comprises (A) an acrylic copolymer; (B) an epoxy resin or a compound derived therefrom; (C) an epoxy compound different from (A) and (B); (D) a photopolymerizable compound; (E) a photoinitiator; and (F) a black colorant.

Advantageous Effects of Invention

The black photosensitive resin composition of the present invention may form a cured film exhibiting good adhesion, good height difference property, good surface roughness and high light shielding property (optical density) and may be effectively used for the formation of a cured film, particularly a black column spacer of a liquid crystal display (LCD) or an organic light-emitting diode (OLED) display.

BEST MODE FOR CARRYING OUT THE INVENTION

Figure 1:
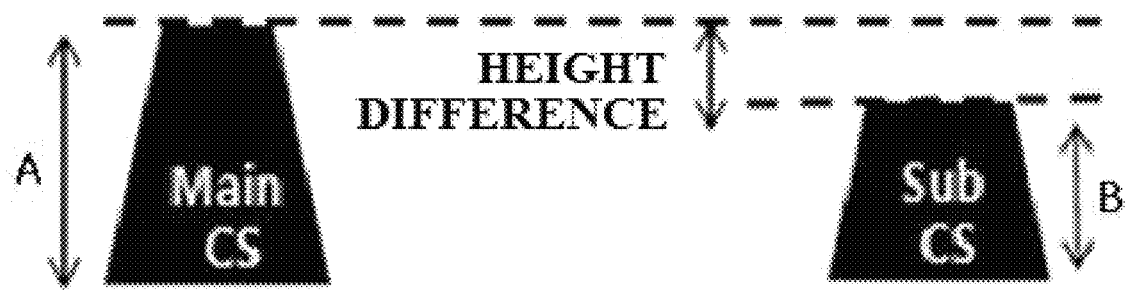
FIG. 1 is a schematic diagram showing each shape and height difference (step) of a main column spacer (Main CS) and a sub column spacer (Sub CS) formed in Experimental Example 1.
Figure 2:
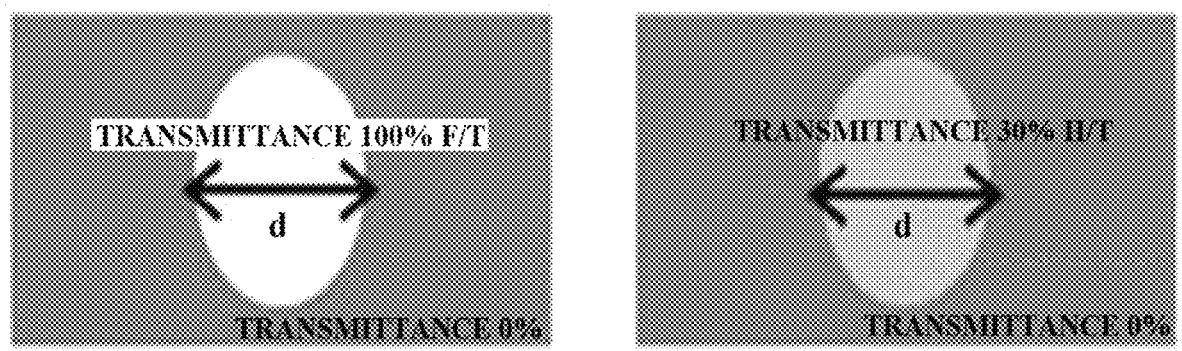
FIG. 2 is a schematic diagram showing each of a mask of a 100% full tone (F/T) column spacer pattern and a mask of a 30% half tone (H/T) column spacer pattern, which are used in Experimental Example 1.

The black photosensitive resin composition according to the present invention may comprise (A) an acrylic copolymer; (B) an epoxy resin or a compound derived therefrom; (C) an epoxy compound different from (A) and (B); (D) a photopolymerizable compound; (E) a photoinitiator; and (F) a black colorant, and may further comprise (G) a solvent, and (H) a surfactant and/or (I) a silane coupling agent as additives, if desired.

Hereinafter, the constituent components of the present invention will be explained in detail.

In the present invention, (meth)acryl means acryl and/or methacryl, and (meth)acrylate means acrylate and/or methacrylate.

(A) Acrylic Copolymer

The black photosensitive resin composition of the present invention may include an acrylic copolymer, which may be a random copolymer.

The copolymer of the present invention includes (A-1) a structural unit derived from an ethylenically unsaturated carboxylic acid, an ethylenically unsaturated carboxylic anhydride or a combination thereof, and (A-2) a structural unit derived from an ethylenically unsaturated compound containing an aromatic ring, and may additionally include (A-3) a structural unit derived from an ethylenically unsaturated compound different from the structural units (A-1) and (A-2).

The copolymer is an alkali-soluble resin for achieving desired developability during a development step and may function as both of a basic support for forming a film after coating and a structure for accomplishing final patterns.

(A-1) Structural Unit Derived from an Ethylenically Unsaturated Carboxylic Acid, an Ethylenically Unsaturated Carboxylic Anhydride, or a Combination Thereof In the present invention, the structural unit (A-1) is derived from an ethylenically unsaturated carboxylic acid, an ethylenically unsaturated carboxylic anhydride, or a combination thereof. The ethylenically unsaturated carboxylic acid or the ethylenically unsaturated carboxylic anhydride is a polymerizable unsaturated monomer having at least one carboxyl group in the molecule.

Particular examples of the ethylenically unsaturated carboxylic acid and the ethylenically unsaturated carboxylic anhydride may include an unsaturated monocarboxylic acid such as (meth)acrylic acid, crotonic acid, α-chloroacrylic acid, and cinnamic acid; an unsaturated dicarboxylic acid and an anhydride thereof such as maleic acid, maleic anhydride, fumaric acid, itaconic acid, itaconic anhydride, citraconic acid, citraconic anhydride, and mesaconic acid; an unsaturated polycarboxylic acid of trivalence or more and an anhydride thereof; and a mono[(meth)acryloyloxyalkyl] ester of a polycarboxylic acid of divalence or more such as mono[2-(meth)acryloyloxyethyl] succinate, and mono[2-(meth)acryloyloxyethyl] phthalate.

The structural unit derived from the above-exemplified compounds may be included in a copolymer alone or as a combination of two or more thereof.

The amount of the structural unit (A-1) may be 5 to 65 mole %, preferably 10 to 50 mole % based on the total number of moles of the structural units constituting the copolymer to easily maintain developability.

(A-2) Structural Unit Derived from an Ethylenically Unsaturated Compound Containing an Aromatic Ring In the present invention, the structural unit (A-2) is derived from an ethylenically unsaturated compound containing an aromatic ring.

Particular examples of the ethylenically unsaturated compound containing an aromatic ring may include phenyl (meth)acrylate, benzyl (meth)acrylate, 2-phenoxyethyl (meth)acrylate, phenoxy diethylene glycol (meth)acrylate, p-nonylphenoxy polyethylene glycol (meth)acrylate, p-nonylphenoxy polypropylene glycol (meth)acrylate, tribromophenyl (meth)acrylate; styrene; styrene containing an alkyl substituent such as methylstyrene, dimethylstyrene, trimethylstyrene, ethylstyrene, diethylstyrene, triethylstyrene, propylstyrene, butylstyrene, hexylstyrene, heptylstyrene, and octylstyrene; styrene having halogen such as fluorostyrene, chlorostyrene, bromostyrene, and iodostyrene; styrene having an alkoxy substituent such as methoxystyrene, ethoxystyrene, and propoxystyrene; 4-hydroxystyrene, p-hydroxy-α-methylstyrene, acetylstyrene; vinyltoluene, divinylbenzene, vinylphenol, o-vinylbenzyl methyl ether, m-vinylbenzyl methyl ether, p-vinylbenzyl methyl ether, o-vinylbenzyl glycidyl ether, m-vinylbenzyl glycidyl ether, p-vinylbenzyl glycidyl ether, or the like.

The structural unit derived from the above-exemplified compounds may be included in a copolymer alone or as a combination of two or more thereof.

Among the above, the styrene compounds are preferred in consideration of polymerization properties.

The amount of the structural unit (A-2) may be 2 to 70 mole %, preferably 5 to 60 mole % in consideration of chemical resistance, based on the total number of moles of the structural units constituting the copolymer.

(A-3) Structural Unit Derived from an Ethylenically Unsaturated Compound Different from the Structural Units (A-1) and (A-2)

The copolymer of the present invention may further include a structural unit (A-3) derived from an ethylenically unsaturated compound different from the structural units (A-1) and (A-2) in addition to the structural units (A-1) and (A-2).

Particular examples of the ethylenically unsaturated compound different from the structural units (A-1) and (A-2) may include an unsaturated carboxylic acid ester such as methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth)acrylate, 3-methoxybutyl (meth)acrylate, ethoxy diethylene glycol (meth)acrylate, methoxy triethylene glycol (meth)acrylate, methoxy tripropylene glycol (meth)acrylate, poly (ethylene glycol) methyl ether (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, isobornyl (meth)acrylate, dicyclopentanyl (meth)acrylate, dicyclopentenyl (meth)acrylate, dicyclopentanyloxyethyl (meth)acrylate, and dicyclopentenyloxyethyl (meth)acrylate; a tertiary amine containing an N-vinyl group such N-vinyl pyrrolidone, N-vinyl carbazole and N-vinyl morpholine; an unsaturated ether such as vinyl methyl ether and vinyl ethyl ether; an ethylenically unsaturated compound containing an epoxy group such as glycidyl (meth)acrylate, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentylmethyl (meth)acrylate, 3,4-epoxycyclohexylmethyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-(2,3-epoxypropoxy)-3,5-dimethylphenylpropyl)acrylamide, 4-hydroxybutyl (meth)acrylate glycidyl ether, allyl glycidyl ether, and 2-methyl allyl glycidyl ether; and an unsaturated imide such as N-phenylmaleimide, N-(4-chlorophenyl)maleimide, N-(4-hydroxyphenyl)maleimide and N-cyclohexylmaleimide.

The structural unit derived from the above-exemplified compounds may be included in a copolymer alone or as a combination of two or more thereof.

Particularly, the structural unit (A-3) may be derived from an ethylenically unsaturated compound containing an epoxy group and/or an unsaturated imide, preferably, glycidyl (meth)acrylate, 4-hydroxybutyl (meth)acrylate glycidyl ether, and/or N-substituted maleimide may be used in consideration of the improvement of copolymerization property and the strength of an insulating film.

The amount of the structural unit (A-3) may be 10 to 80 mole %, preferably 20 to 75 mole %, based on the total number of moles of the structural units constituting the copolymer. Within this amount range, the storage stability of a black photosensitive resin composition may be maintained and the retention rate may be improved.

Examples of the copolymer having the structural units (A-1) to (A-3) may include a (meth)acrylic acid/styrene copolymer, a (meth)acrylic acid/benzyl (meth)acrylate copolymer, a (meth)acrylic acid/styrene/methyl (meth)acrylate copolymer, a (meth)acrylic acid/styrene/methyl (meth)acrylate/glycidyl (meth)acrylate copolymer, a (meth)acrylic acid/styrene/methyl (meth)acrylate/glycidyl (meth)acrylate/N-phenyl maleimide copolymer, a (meth)acrylic acid/styrene/methyl (meth)acrylate/glycidyl (meth)acrylate/N-cyclohexyl maleimide copolymer, a (meth)acrylic acid/styrene/n-butyl (meth)acrylate/glycidyl (meth)acrylate/N-phenyl maleimide copolymer, a (meth)acrylic acid/styrene/4-hydroxybutyl (meth)acrylate glycidyl ether/N-phenyl maleimide copolymer, a (meth)acrylic acid/styrene/glycidyl (meth)acrylate/N-phenyl maleimide copolymer, or the like.

One or more copolymers may be included in the black photosensitive resin composition.

The amount of the copolymer in the entire black photosensitive resin composition may be 5 to 60 wt %, preferably, 7 to 50 wt %, more preferably, 10 to 40 wt % based on the total amount of the black photosensitive resin composition excluding solvents (i.e., based on solid content). Within this range, the composition would produce a coating film having a good profile after development and improved chemical resistance.

The weight average molecular weight (Mw) of the copolymer thus prepared with reference to polystyrene, may be in the range of 3,000 to 50,000, preferably, 5,000 to 40,000, when determined by gel permeation chromatography (GPC, using tetrahydrofuran as eluent). Within this range, the composition would have good adhesion to a substrate, physical/chemical properties, and viscosity.

The copolymer may be prepared by charging a molecular weight regulator, a radical polymerization initiator, a solvent, and respective compounds that provide the structural units (A-1) to (A-3), introducing nitrogen, and subjecting the mixture to polymerization with slow agitation.

The molecular weight regulator may be a mercaptan compound such as butyl mercaptan and octyl mercaptan, or an α-methylstyrene dimer, but is not limited thereto.

The radical polymerization initiator may be an azo compound such as 2,2'-azobisisobutyronitrile, 2,2'-azobis(2,4-dimethylvaleronitrile), and 2,2'-azobis(4-methoxy-2,4-dimethylvaleronitrile), benzoyl peroxide, lauryl peroxide, t-butyl peroxypivalate and 1,1-bis(t-butylperoxy)cyclohexane, but is not limited thereto. The radical polymerization initiator may be used alone or as a mixture of two or more thereof.

Also, the solvent may be any solvent commonly used in the preparation of a copolymer and may include, e.g., propylene glycol monomethyl ether acetate (PGMEA).

(B) Epoxy Resin or Compound Derived Therefrom

The black photosensitive resin composition of the present invention includes an epoxy resin or a compound derived therefrom. Preferably, the epoxy resin or the compound derived therefrom may have a cado backbone structure. The epoxy resin or the compound derived therefrom may have a weight average molecular weight when determined by gel permeation chromatography, with reference to polystyrene, of 3,000 to 18,000, preferably, 5,000 to 10,000. Within this range, the resin composition would produce a coating film having a good height difference property and a good pattern profile after development.

Particularly, the epoxy resin having a cado backbone structure may be represented by the following Formula 1:

[Formula 1]

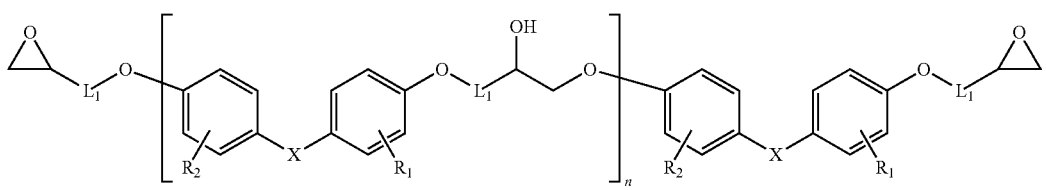

in Formula 1,

X is each independently

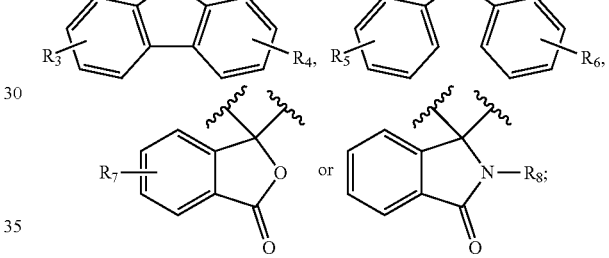

$L^1$ is each independently $C_{1-10}$ alkylene, $C_{3-20}$ cycloalkylene, or $C_{1-10}$ alkyleneoxy;

$R_1$ to $R_7$ are each independently H, $C_{1-10}$ alkyl, $C_{1-10}$ alkoxy, $C_{2-10}$ alkenyl, or $C_{6-14}$ aryl;

$R_8$ is H, methyl, ethyl, $CH_3CHCl-$, $CH_3CHOH-$, $CH_2=CHCH_2-$, or phenyl; and n is an integer of 0 to 10.

Particular examples of $C_{1-10}$ alkylene may include methylene, ethylene, propylene, isopropylene, butylenes, isobutylene, sec-butylene, t-butylene, pentylene, isopentylene, t-pentylene, hexylene, heptylene, octylene, isooctylene, t-octylene, 2-ethylhexylene, nonylene, isononylene, decylene, isodecylene, or the like.

Particular examples of $C_{3-20}$ cycloalkylene may include cyclopropylene, cyclobutylene, cyclopentylene, cyclohexylene, cycloheptylene, decalinylene, adamantylene, or the like.

Particular examples of $C_{1-10}$ alkyleneoxy may include methyleneoxy, ethyleneoxy, propyleneoxy, butyleneoxy, sec-butyleneoxy, t-butyleneoxy, pentyleneoxy, hexyleneoxy, heptyleneoxy, octyleneoxy, 2-ethyl-hexyleneoxy, or the like.

Particular examples of $C_{1-10}$ alkyl may include methyl, ethyl, propyl, isopropyl, butyl, isobutyl, sec-butyl, t-butyl, pentyl, isopentyl, t-pentyl, hexyl, heptyl, octyl, isooctyl, t-octyl, 2-ethylhexyl, nonyl, isononyl, decyl, isodecyl, or the like.

Particular examples of $C_{1-10}$ alkoxy may include methoxy, ethoxy, propoxy, butyloxy, sec-butoxy, t-butoxy, pentoxy, hexyloxy, heptoxy, octyloxy, 2-ethyl-hexyloxy, or the like.

Particular examples of $C_{2-10}$ alkenyl may include vinyl, allyl, butenyl, propenyl, or the like.

Particular examples of $C_{6-14}$ aryl may include phenyl, tolyl, xylyl, naphthyl, or the like.

In a preferred example, the epoxy resin having the cardo backbone structure may be prepared through the synthesis route of below:

[Reaction Scheme 1]

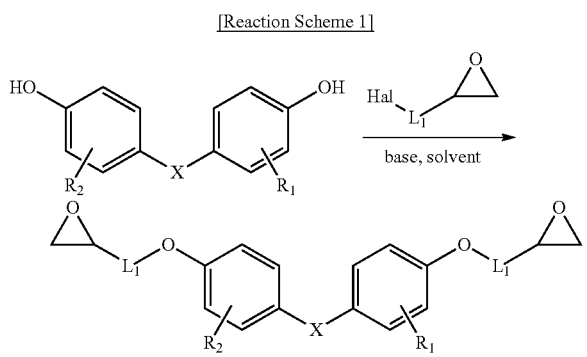

in Reaction Scheme 1,

Hal is halogen; and X, $R_1$, $R_2$ and $L_1$ are the same as defined in Formula 1.

The compound derived from an epoxy resin having a cado backbone structure may be a compound obtained by reacting an epoxy resin having a cado backbone structure with an unsaturated basic acid to produce an epoxy adduct and then reacting the epoxy adduct with a polybasic anhydride, or by further reacting the product thus obtained with a monofunctional or polyfunctional epoxy compound.

The unsaturated basic acid may use well-known acids including acrylic acid, methacrylic acid, crotonic acid, cinnamic acid, sorbic acid, or the like.

The polybasic anhydride may use well-known compounds including succinic anhydride, maleic anhydride, trimellitic anhydride, pyromellitic anhydride, 1,2,4,5-cyclohexane tetracarboxylic dianhydride, hexahydrophthalic anhydride, or the like.

The monofunctional or polyfunctional epoxy compound may use well-known compounds including glycidyl methacrylate, methyl glycidyl ether, ethyl glycidyl ether, propyl glycidyl ether, isopropyl glycidyl ether, butyl glycidyl ether, isobutyl glycidyl ether, bisphenol Z glycidyl ether, or the like.

In a preferred example, the compound derived from the epoxy resin having the cardo backbone structure may be prepared through the synthesis route of below:

[Reaction Scheme 2]

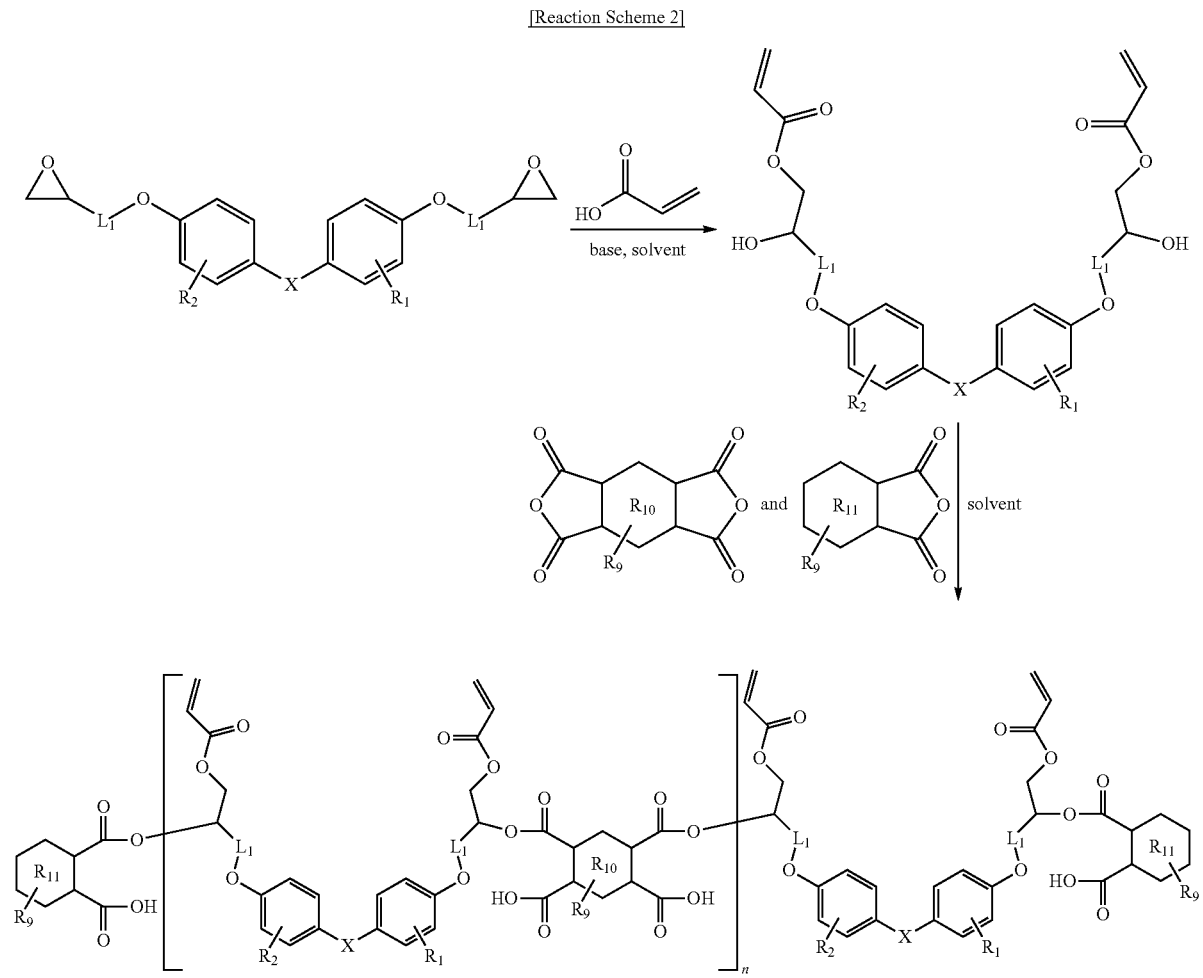

in Reaction Scheme 2,

R₉ is each independently H, a C$_{1-10}$ alkyl group, a C$_{1-10}$ alkoxy group, a C$_{2-10}$ alkenyl group, or a C$_{6-14}$ aryl group;

R₁₀ and R₁₁ are each independently a saturated or unsaturated C₆ aliphatic ring, or a benzene ring;

n is an integer from 1 to 10; and

X, R₁, R₂ and L₁ are the same as defined in Formula 1.

When the epoxy resin having the cado backbone structure or the compound derived therefrom is used, the cado backbone structure may improve adhesion between a cured product and a substrate, alkaline resistance, processability, strength, etc., and may produce more accurate images from minute patterns after removing uncured parts by development.

The amount of the epoxy resin or the compound derived therefrom may be 5 to 50 wt %, preferably, 7 to 40 wt %, more preferably, 10 to 35 wt % based on the total weight of a black photosensitive resin composition excluding solvents (i.e., based on solid content). Within the range, resolution and chemical resistance may be improved, and pattern profile maintaining pattern shape with a constant height difference to a desired margin width (allowed width) between patterns may be favorably attained.

As described above, the black photosensitive resin composition of the present invention may include 10 to 40 wt % of the acrylic copolymer (A) based on the total weight of the black photosensitive resin composition (based on solid content) and may include 10 to 40 wt % of the epoxy resin or the compound derived therefrom (B) based on the total weight of the black photosensitive resin composition (based on solid content). In this case, the weight ratio of acrylic copolymer (A):the epoxy resin or the compound derived therefrom (B) may be 40 to 80:60 to 20, and particularly, 40 to 75:60 to 25.

(C) Epoxy Compound Different from (A) and (B)

The black photosensitive resin composition of the present invention includes an epoxy compound other than (A) and (B), and such epoxy compound may be a homopolymer or copolymer having a structural unit derived from a monomer having an epoxy group and an unsaturated double bond.

Examples of the monomer having an epoxy group and an unsaturated double bond may include glycidyl (meth)acrylate, 4-hydroxybutyl acrylate glycidyl ether, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentylmethyl (meth)acrylate, 3,4-epoxycyclohexylmethyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-(2,3-epoxypropoxy)-3,5-dimethylphenylpropyl)acrylamide, allyl glycidyl ether, 2-methyl allyl glycidyl ether, o-vinylbenzyl glycidyl ether, m-vinylbenzyl glycidyl ether, p-vinylbenzyl glycidyl ether, or a mixture thereof, preferably, glycidyl (meth)acrylate, 4-hydroxybutyl acrylate glycidyl ether, or 3,4-epoxycyclohexylmethyl (meth)acrylate.

Other monomers copolymerizable with the monomer having an epoxy group and an unsaturated double bond include at least one selected from the group consisting of an unsaturated carboxylic acid ester such as methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl-α-hydroxymethylacrylate, ethyl-α-hydroxymethylacrylate, propyl-α-hydroxymethylacrylate, butyl-α-hydroxymethylacrylate, 2-methoxyethyl (meth)acrylate, 3-methoxybutyl (meth)acrylate, ethoxy diethylene glycol (meth)acrylate, methoxy triethylene glycol (meth)acrylate, methoxy tripropylene glycol (meth)acrylate, poly(ethylene glycol) methyl ether (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, isobornyl (meth)acrylate, dicyclopentanyl (meth)acrylate, dicyclopentenyl (meth)acrylate, dicyclopentanyloxyethyl (meth)acrylate, and dicyclopentenyloxyethyl (meth)acrylate; an unsaturated imide such as maleimide, N-phenylmaleimide, N-(4-chlorophenyl)maleimide, N-(4-hydroxyphenyl)maleimide and N-cyclohexylmaleimide, phenyl (meth)acrylate, benzyl (meth)acrylate, 2-phenoxyethyl (meth)acrylate, phenoxy diethylene glycol (meth)acrylate, p-nonylphenoxy polyethylene glycol (meth)acrylate, p-nonylphenoxy polypropylene glycol (meth)acrylate, tribromophenyl (meth)acrylate; styrene; styrene containing an alkyl substituent such as methylstyrene, dimethylstyrene, trimethylstyrene, ethylstyrene, diethylstyrene, triethylstyrene, propylstyrene, butylstyrene, hexylstyrene, heptylstyrene, and octylstyrene; styrene having halogen such as fluorostyrene, chlorostyrene, bromostyrene, and iodostyrene; styrene having an alkoxy substituent such as methoxystyrene, ethoxystyrene, and propoxystyrene; 4-hydroxystyrene, p-hydroxy-α-methylstyrene, acetylstyrene; vinyltoluene, divinylbenzene, vinylphenol, o-vinylbenzyl methyl ether, m-vinylbenzyl methyl ether, and p-vinylbenzyl methyl ether.

The epoxy compound used in the present invention may be synthesized by a conventional method.

Meanwhile, an ethylenically unsaturated carboxylic acid, an ethylenically unsaturated carboxylic anhydride, or a mixture thereof may be added to a (co)polymer derived from a monomer having an epoxy group and an unsaturated double bond and may be polymerized, to produce a copolymer having an epoxy group and a double bond in a side chain.

The ethylenically unsaturated carboxylic acid, the ethylenically unsaturated carboxylic anhydride, or a mixture thereof may be at least one selected from the group consisting of an unsaturated monocarboxylic acid such as (meth)acrylic acid, crotonic acid, alpha-chloroacrylic acid and cinnamic acid; an unsaturated dicarboxylic acid and an anhydride thereof such as maleic acid, maleic anhydride, fumaric acid, itaconic acid, itaconic anhydride, citraconic acid, citraconic anhydride, and mesaconic acid; an unsaturated polycarboxylic acid of trivalence or more and an anhydride thereof; and a mono[(meth)acryloyloxyalkyl] ester of a polycarboxylic acid of divalence or more such as mono[2-(meth)acryloyloxyethyl] succinate, and mono[2-(meth)acryloyloxyethyl] phthalate.

The copolymer having an epoxy group and a double bond in a side chain is preferable in consideration of retention rate.

The amount of the epoxy compound may be 0.1 to 10 wt %, preferably, 0.1 to 5 wt % based on the total weight of the photosensitive resin composition excluding solvents (based on solid content). Within this range, adhesion after development or adhesion after immersing in an NMP solvent may be improved.

The weight average molecular weight of the epoxy compound ((co)polymer derived from a monomer having an epoxy group and an unsaturated double bond) may be in the range of 1,000 to 9,000, preferably, 1,000 to 7,000, more preferably, 2,000 to 5,000 when determined by gel permeation chromatography with reference to polystyrene. With the weight average molecular weight, adhesion may be improved and good chemical resistance may be attained.

(D) Photopolymerizable Compound

The photopolymerizable compound of the present invention is a compound capable of being polymerized by the function of a photoinitiator and may include a polyfunctional monomer, oligomer, or polymer, which is generally used in a black photosensitive resin composition.

More particularly, the photopolymerizable compound may include a monofunctional or polyfunctional ester compound of acrylic acid or methacrylic acid having at least one ethylenically unsaturated group. A polyfunctional compound having at least two functional groups may be preferable in consideration of chemical resistance.

The photopolymerizable compound may be selected from the group consisting of ethylene glycol di(meth)acrylate, propylene glycol di(meth)acrylate, diethylene glycol di(meth)acrylate, triethylene glycol di(meth)acrylate, 1,6-hexanediol di(meth)acrylate, polyethylene glycol di(meth)acrylate, polypropylene glycol di(meth)acrylate, glycerin tri(meth) acrylate, trimethylolpropane tri(meth)acrylate, pentaerythritol tri(meth)acrylate, monoester of pentaerythritol tri(meth) acrylate and succinic acid, pentaerythritol tetra(meth) acrylate, dipentaerythritol penta(meth)acrylate, dipentaerythritol hexa(meth)acrylate, monoester of dipentaerythritol penta(meth)acrylate and succinic acid, caprolactone modified dipentaerythritol hexa(meth)acrylate, pentaerythritol triacrylate hexamethylene diisocyanate (a reaction product of pentaerythritol triacrylate and hexamethylene diisocyanate), tripentaerythritol hepta(meth)acrylate, tripentaerythritol octa(meth)acrylate, bisphenol A epoxyacrylate, ethylene glycol monomethyl ether acrylate, and a mixture thereof, but is not limited thereto.

The amount of the photopolymerizable compound may be 1 to 50 wt %, preferably 5 to 40 wt % on the basis of the total weight of the black photosensitive resin composition excluding solvents (i.e., based on solid content). Within this range, the resin composition would readily form a pattern without generating defects of pattern profile such as scum at the bottom part during development.

(E) Photopolymerization Initiator

The photopolymerization initiator used in the present invention may be any known polymerization initiator.

The photopolymerization initiator may be selected from the group consisting of an acetophenone compound, a non-imidazole compound, a triazine compound, an onium compound, a benzoin compound, a benzophenone compound, a diketone compound, an α-diketone compound, a polynuclear quinone compound, a thioxanthene compound, a diazo compound, an imidesulfonate compound, an oxime compound, a carbazole compound, a sulfonium borate compound, and a mixture thereof.

Preferred for high sensitivity are one or more oxime compounds disclosed in Korean Laid-open Patent Publication Nos. 2004-0007700, 2005-0084149, 2008-0083650, 2008-0080208, 2007-0044062, 2007-0091110, 2007-0044753, 2009-0009991, 2009-0093933, 2010-0097658, 2011-0059525, 2011-0091742, 2011-0026467, and 2011-0015683, and International Publication Nos. WO 2010/102502, and WO 2010/133077. Preferred for high sensitivity and resolution are commercially available photopolymerization initiators such as OXE-01 (BASF Co. Ltd.), OXE-02 (BASF Co. Ltd.), OXE-03 (BASF Co. Ltd.), N-1919 (ADEKA Co. Ltd.), NCI-930 (ADEKA Co. Ltd.) and NCI-831 (ADEKA Co. Ltd.).

The photopolymerization initiator may be included in an amount of 0.01 to 15 wt %, preferably 0.1 to 10 wt %, based on the total solid content (excluding solvents) of the photosensitive resin composition. Within this range, curing by exposure may be sufficiently attained, and a column spacer having good elasticity recovery ratio may be manufactured.

(F) Black Colorant

The black photosensitive resin composition of the present invention includes a black colorant for imparting light shielding properties.

The black colorant used in the present invention may be a black inorganic colorant, a black organic colorant, or a mixture thereof.

The black inorganic colorant and the black organic colorant may be any known material and may include any compound, for example, classified as a pigment by color index (The Society of Dyers and Colourists printed), and any known dye may be included. In addition, any colorant with a chromatic color such as blue may be optionally included in addition to the black colorant.

Particular examples of the black inorganic colorant may include carbon black, titanium black, Cu—Fe—Mn-based oxides, and metal oxides such as synthetic iron black. Among them, carbon black is preferable in consideration of pattern properties and chemical resistance.

In addition, particular examples of the black organic colorant may include aniline black, lactam black, perylene black, etc. Among them, lactam black (for example, Black 582 of BASF) may preferably be used in consideration of optical density, dielectricity, etc.

The black colorant may include 90 wt % or more of the black inorganic colorant on the basis of the total weight of the colorant (based on solid content), and may additionally include 0 to 10 wt % of the black organic colorant. Within this range, high optical density capable of preventing the leakage of light in visible and infrared regions may be favorably attained.

The amount of the black colorant may be 10 to 60 wt %, 20 to 50 wt %, 20 to 45 wt %, 25 to 50 wt %, or 25 to 45 wt % based on the total weight of the black photosensitive resin composition excluding solvents (i.e., based on solid content).

Within this range, high optical density capable of preventing the leakage of light may be favorably attained.

Particularly, when the black photosensitive resin composition of the present invention is cured to a film having a thickness of 1 µm, optical density of 0.5 to 2.5, preferably, 0.8 to 2.0, more preferably, 1.0 to 2.3, more preferably, 1.0 to 2.0, may be attained. Within this range, the prevention of light leakage may be effectively accomplished.

Meanwhile, in order to disperse a black dispersant in the black photosensitive resin composition of the present invention, a dispersant may be used. Such dispersant may be any known dispersant of a colorant.

Particular examples of the dispersant may include a cationic surfactant, an anionic surfactant, a nonionic surfactant, a zwitterionic surfactant, a silicone-based surfactant, a fluorine-based surfactant, or the like. Commercially available dispersant may include Disperbyk-182, -183, -184, -185, -2000, -2150, -2155, -2163, -2164, etc. of BYK Co. Ltd. The materials may be used alone or as a combination of two or more thereof. The dispersant may be used by adding to a colorant by a method treating the surface of the colorant in advance, or may be used by adding together with a colorant in the process of preparing a black photosensitive resin composition.

In addition, after mixing a black colorant with a binder, the mixture may be used for the preparation of a black photosensitive resin composition. Such binder may be the copolymer (A) described above, a known copolymer, or a mixture thereof.

Accordingly, the colorant used in the present invention may be added to a black photosensitive resin composition in the form of a colorant mill base obtained by mixing the colorant with a dispersant, a binder, a solvent, etc.

(G) Solvent

The black photosensitive resin composition of the present invention may preferably be prepared as a liquid composition mixing the above components with a solvent. The solvent may be any known solvent used in a black photosensitive resin composition, as long as the solvent has compatibility but not reactivity with the components of the black photosensitive resin composition.

Examples of such solvent may include glycol ethers such as ethylene glycol monoethyl ether; ethylene glycol alkyl ether acetates such as ethyl cellosolve acetate; esters such as ethyl 2-hydroxypropionate; diethylene glycols such as diethylene glycol monomethyl ether; propylene glycol alkyl ether acetates such as propylene glycol monomethyl ether acetate, and propylene glycol propyl ether acetate; and alkoxyalkyl acetates such as 3-methoxybutyl acetate. The solvents may be used alone or as a combination of two or more thereof.

The amount of the solvent is not particularly limited, and may be an amount such that the total concentration of each component of the composition excluding solvents (i.e., based on solid content) may be 5 to 70 wt %, preferably, 10 to 55 wt %, in consideration of the coatability and stability of a final black photosensitive resin composition.

(H) Surfactant

The black photosensitive resin composition of the present invention may further include a surfactant, if desired, to enhance its coatability and to prevent the generation of defects.

The type of surfactants is not particularly limited, but preferred are fluorine-based surfactants, silicon-based surfactants, and the like.

Commercially available silicon-based surfactant may include DC3PA, DC7PA, SH11PA, SH21PA, and SH8400 manufactured by Dow Corning Toray Silicon, TSF-4440, TSF-4300, TSF-4445, TSF-4446, TSF-4460, and TSF-4452 manufactured by GE Toshiba Silicon, and BYK-333, BYK 307, BYK 3560, BYK UV 3535, BYK 361N, BYK 354, and BYK 399 manufactured by BYK. These surfactants may be used alone or in combination of two or more thereof. Commercially available fluorine-based surfactant may include Megaface F-470, F-471, F-475, F-482, F-489, F-563, RS-55, etc. manufactured by Dai Nippon Ink Kagaku Kogyo (DIC). Among them, BYK 333, and BYK 307 of BYK, F-563 of DIC, and Megaface RS-55 of Dai Nippon Ink Kagaku Kogyo may be used.

The amount of the surfactant may be 0.01 to 10 wt %, preferably, 0.05 to 5 wt %, based on the total weight of the black photosensitive resin composition excluding solvents (i.e., based on solid content). Within the amount range, the black photosensitive resin composition can be readily coated.

(I) Silane Coupling Agent

The black photosensitive resin composition of the present invention, if desired, may additionally include a silane coupling agent containing a reactive substituent selected from the group consisting of carboxyl, (meth)acryloyl, isocyanate, amino, mercapto, vinyl, epoxy, and a combination thereof, as an adhesion assisting agent to improve the adhesion of a coating to a substrate.

The kind of the silane coupling agent is not particularly limited and may be selected from the group consisting of trimethoxysilyl benzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane, γ-glycidoxypropyltriethoxysilane, β-(3,4-epoxycyclohexyl)ethyltrimethoxysilane, phenylaminotrimethoxysilane, and a mixture thereof.

Preferred is γ-isocyanatopropyltriethoxysilane containing an isocyanate group (e.g., KBE-9007 manufactured by Shin-Etsu) or phenylaminotrimethoxysilane, which can maintain chemical resistance and have good adhesion of a coating to a substrate.

The amount of the silane coupling agent may be 0.01 to 10 wt %, preferably, 0.05 to 5 wt % based on the total weight of the black photosensitive resin composition excluding solvents (i.e., based on solid content). Within this amount range, the adhesion of the black photosensitive resin composition may be further improved.

Besides, the black photosensitive resin composition of the present invention may further include other additives such as an antioxidant and a stabilizer as long as the physical properties of the composition are not adversely affected.

Even when the black photosensitive resin composition of the present invention includes a large amount of a black colorant (pigment), a cured film prepared therefrom shows good adhesion, height difference, surface roughness, and light shielding properties.

Preparation Method of Black Photosensitive Resin Composition

A black photosensitive resin composition including the above-described components according to the present invention may be prepared by a conventional method, and an embodiment thereof is as follows.

First, a black colorant is mixed with a solvent in advance and then is dispersed using a bead mill, etc. until a desired average particle diameter of the black colorant is obtained. In such case, if necessary, a surfactant may be used, and part of or the entire copolymer may be mixed. To the dispersion, the remaining copolymer, an epoxy resin or a compound derived therefrom, an epoxy compound, a photopolymerization compound and a photoinitiator are added, and if desired, an additive such as a surfactant and a silane coupling agent is added, or an additional solvent is mixed to attain a certain concentration. The mixture is sufficiently agitated to produce a black photosensitive resin composition of the present invention.

Black Column Spacer

The present invention provides a black column spacer (BCS) formed using the black photosensitive resin composition. An embodiment of a black column spacer pattern is shown in FIG. 1.

The black column spacer may be manufactured via the steps of forming a coating film, exposing, developing, and heating.

In the forming step of a coating film, a black photosensitive resin composition according to the present invention is coated by a spin or slit coating method, a roll coating method, a screen printing method, an applicator method, etc. in a thickness of, for example, 1 to 25 μm, on a pre-treated substrate and then is pre-cured to remove solvents at a temperature of 70° C. to 100° C. for 1 to 10 minutes to form a coating film.

In order to form a pattern in the coating film thus obtained, a mask having a certain shape is disposed, and an activation beam of 200 to 500 nm is irradiated. In order to manufacture a black column spacer having a height difference, a mask having a pattern with different light transmittances may be used to accomplish a main column spacer and a sub column spacer at the same time. As a light source used for irradiation, a low pressure mercury lamp, a high pressure mercury lamp, a ultra-high pressure mercury lamp, a metal halogenide lamp, an argon gas laser, or the like may be used, and X-rays, electron beams, etc. may be used if necessary. Exposure intensity varies with the kind, and the mixing ratio of each component in the composition and the thickness of a dried film, and may be 500 mJ/cm$^2$ or less (at a wavelength of 365 nm) for a high pressure mercury lamp.

After the exposing step, unnecessary parts are dissolved and removed using an aqueous alkaline solution such as sodium carbonate, sodium hydroxide, potassium hydroxide, and tetramethylammonium hydroxide, as a developing solution to maintain exposed parts only to form a pattern. After cooling the image pattern obtained by development to room temperature, the pattern was post-baked at a temperature of 180° C. to 250° C. for 10 to 60 minutes in a hot air convention oven type drying furnace to obtain a desired final pattern.

Owing to good physical properties, the black column spacer thus manufactured may be useful as electronic parts of an LCD, OLED display, or the like. The LCD, OLED display, or the like may include well-known parts to a person skilled in the art in addition to the spacer of the present invention. That is, an LCD, OLED display, or the like in which the black column spacer of the present invention may be applied, may be encompassed by in the present invention.

MODE FOR THE INVENTION

Hereinafter, the present invention is explained in detail with reference to the following examples. However, the examples are intended to further illustrate the present invention, and its scope is not limited thereto.

In the following preparation examples, the weight average molecular weight is determined by gel permeation chromatography (GPC) using a polystyrene standard.

Preparation Example 1: Preparation of Acrylic Copolymer (A)

To a 500 mL, round-bottomed flask equipped with a refluxing condenser and a stirrer, 100 g of a mixture of monomers containing 51 mol % of N-phenylmaleimide, 4 mol % of styrene, 10 mol % of 4-hydroxybutyl acrylate glycidyl ether, and 35 mol % of methacrylic acid, 300 g of propylene glycol monomethyl ether acetate (PGMEA) as a solvent, and 2 g of 2,2'-azobis(2,4-dimethylvaleronitrile) as a radical polymerization initiator were added, followed by elevating the temperature to 70° C. and stirring for 5 hours to produce a copolymer having a solid content of 31%. The acid value of the copolymer thus obtained was 100 mgKOH/g, and the weight average molecular weight determined by gel permeation chromatography (GPC) using polystyrene standard was 20,000.

Preparation Example 2: Preparation of Compound Derived from Epoxy Resin Having Cardo Backbone Structure (B)

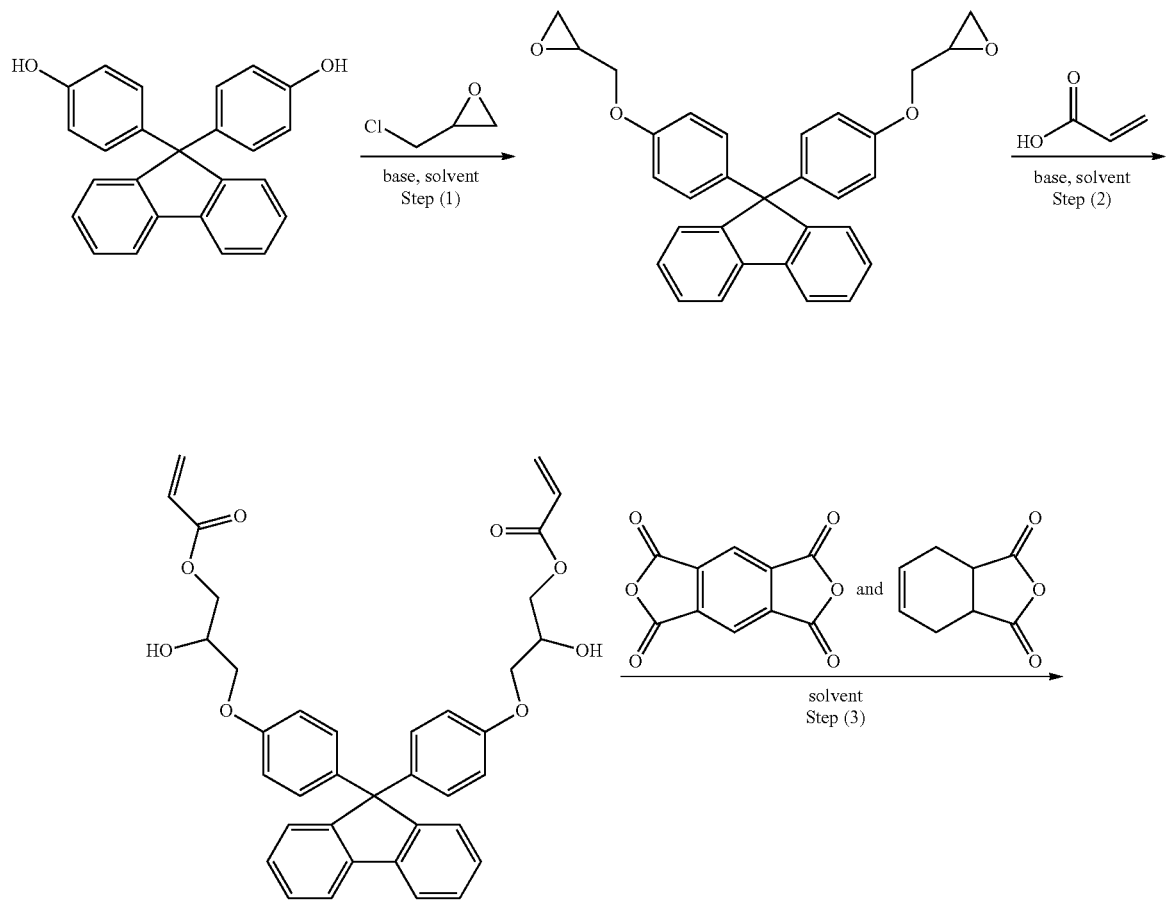

-continued

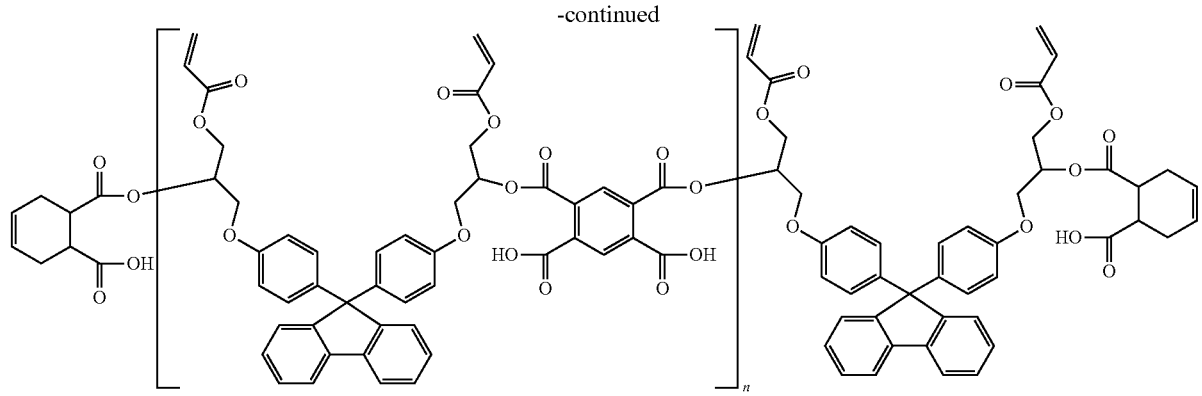

Step (1): Preparation of 9,9-bis[4-(glycidyloxy)phenyl]fluorene

To a 3,000 mL three-neck round-bottom flask, 200 g of toluene, 125.4 g of 4,4'-(9-fluorenylidene)diphenol and 78.6 g of epichlorohydrin were added, and heated to 40° C. with stirring to obtain a solution. 0.1386 g of t-butylammonium bromide and a 50% NaOH aqueous solution (3 eq) were mixed in a vessel and the mixture was slowly added to the resulting solution with stirring.

The reaction mixture thus obtained was heated to 90° C. for 1 hour to remove 4,4'-(9-fluorenylidene)diphenol completely, which was confirmed by HPLC or TLC. The reaction mixture was cooled to 30° C., and 400 mL of dichloromethane and 300 mL of 1N HCl were added thereto with stirring. Then, the organic layer was separated, washed with 300 mL of distilled water twice or three times, dried over magnesium sulfate, and distilled under a reduced pressure to remove dichloromethane. The resultant was recrystallized using a mixture of dichloromethane and methanol to obtain the title compound, an epoxy resin compound.

Step (2): Preparation of (((9H-fluorene-9,9-diyl)bis (4,1-phenylene))bis(oxy))bis(2-hydroxypropane-3,1-diyl) diacrylate (CAS No. 143182-97-2)

To a 1,000 mL three-neck flask, 115 g of the compound obtained in step (1), 50 mg of tetramethylammonium chloride, 50 mg of 2,6-bis(1,1-dimethylethyl)-4-methylphenol and 35 g of acrylic acid were added. The mixture was heated to 90 to 100° C. while blowing air at a flow rate of 25 mL/min and further heated to 120° C. to obtain a solution. The resulting solution was stirred for about 12 hours until its acid value dropped to less than 1.0 mg KOH/g and then cooled to room temperature. 300 mL of dichloromethane and 300 mL of distilled water were added to the reaction mixture with stirring. Then, the organic layer was separated, washed with 300 mL of distilled water twice or three times, dried over magnesium sulfate, and distilled under a reduced pressure to remove dichloromethane, thereby providing the title compound.

Step (3): Preparation of a Compound Derived from an Epoxy Resin Having a Cardo Backbone Structure The compound obtained in step (2) in PGMEA was placed into a 1,000 mL three-neck flask, and 1,2,4,5-benzenetetracarboxylic dianhydride (0.75 eq), 1,2,3,6-tetrahydrophthalic anhydride (0.5 eq) and triphenylphosphine (0.01 eq) were further added thereto. The reaction mixture was heated to 120 to 130° C. for 2 hours with stirring and then cooled to 80 to 90° C., followed by stirring for 6 hours. After cooling to room temperature, a solution (solid content of 49 wt %) of polymer having a weight average molecular weight (Mw) of 6,000 and an acid value of 107 mg KOH/g (based on solid content) was obtained.

Preparation Example 3: Preparation of Epoxy Compound (C)-(C-1)

To a flask equipped with a stirrer, a thermometer, a nitrogen gas replacement apparatus, and a refluxing condenser, 450 g of PGMEA was added as a solvent, and 150 g of 3,4-epoxycyclohexylmethyl methacrylate and 3 g of 2,2'-azobisisobutyronitrile were added thereto. The reaction was carried out for 30 minutes, and nitrogen replacement was made. The flask which could be separated was immersed in an oil bath and stirred while maintaining the reaction temperature to 80° C. for performing polymerization for 5 hours. The concentration of the solid thus obtained was 22 wt % and a compound having the weight average molecular weight of 5,500 was obtained.

Preparation Example 4: Preparation of Epoxy Compound (C)-(C-2)

To a flask equipped with a stirrer, a thermometer, a nitrogen gas replacement apparatus, and a refluxing condenser, 450 g of PGMEA was added as a solvent, and 150 g of glycidyl methacrylate and 3 g of 2,2'-azobisisobutyronitrile were added thereto. The reaction was carried out for 30 minutes, and nitrogen replacement was made. The flask which could be separated was immersed in an oil bath and stirred while maintaining the reaction temperature to 80° C. for performing polymerization for 5 hours. The concentration of the solid thus obtained was 22 wt % and a compound having the weight average molecular weight of 4,000 was obtained.

Preparation Example 5: Preparation of Epoxy Compound (C)-(C-3)

To a flask equipped with a stirrer, a thermometer, a nitrogen gas replacement apparatus, and a refluxing condenser, 450 g of PGMEA was added as a solvent, and 150 g of 4-hydroxybutyl acrylate glycidyl ether and 3 g of 2,2'-azobisisobutyronitrile were added thereto. The reaction was carried out for 30 minutes, and nitrogen replacement was made. The flask which could be separated was immersed in an oil bath and stirred while maintaining the reaction temperature to 80° C. for performing polymerization for 5 hours. The concentration of the solid thus obtained was 22 wt % and a compound having the weight average molecular weight of 7,000 was obtained.

Preparation Example 6: Preparation of Inorganic Colored Dispersion (F-1) (Inorganic Black Dispersion)

The colored dispersion (F-1) was supplied from Tokushiki Co., which was prepared by the following method;

8 g of an acrylic copolymer solution (Tokushiki Co.) having a weight average molecular weight of 12,000 to 20,000 g/mol and an acid value of 80 to 150 mgKOH/g, 8 g of an acrylic polymer dispersion (Tokushiki Co.) having an amine value of 100 to 140 mgKOH/g, 80 g of carbon black as inorganic black, and 384 g of PGMEA as a solvent were dispersed using a paint shaker at 25° C. for 6 hours. The dispersion was carried out using 0.3 mm zirconia beads.

Example 1

4 g (solid content) of the copolymer (A) prepared in Preparation Example 1 as a copolymer, 2.8 g (solid content) of the compound derived from epoxy resin (B) prepared in Preparation Example 2, 4.9 g of DPHA (Nippon Kayaku) as a photopolymerization compound (D), 0.2 g of an oxime photoinitiator (OXE-03, BASF) as a photopolymerization initiator (E), 0.2 g of a triazine initiator (T-Y, Pharmasynthese), 0.2 g (solid content) of the epoxy compound (C-1) prepared in Preparation Example 3, and 6.7 g (solid content) of the colored dispersion (F-1) prepared in Preparation Example 6 were mixed in 81 g of PGMEA as a solvent (G) by a conventional method, followed by stirring for 5 hours to prepare a black photosensitive resin composition.

Examples 2 to 7 and Comparative Examples 1 to 3

Black photosensitive resin compositions were prepared by carrying out the same procedure described in Example 1 except for changing the kind and/or amount of each component as listed in Table 1 below.

TABLE 1

| | Acrylic copolymer (A) Prep. Ex. 1 | Compound derived from epoxy resin (B) Prep. Ex. 2 | Epoxy compound (C) different from (A) and (B) | | | Photopoly- merizable compound (D) DPHA | Photopoly- merization initiator (E) OXE-03 T-Y | | Black colorant (F) | | Solvent (G) PGMEA |
|---|---|---|---|---|---|---|---|---|---|---|---|
| | | | Prep. Ex. 3 (C-1) | Prep. Ex. 4 (C-2) | Prep. Ex. 5 (C-3) | | | | Prep. Ex. 6 (F-1) | Prep. Ex. 7 (F-2) | |
| Example 1 | 4 g | 2.8 g | 0.2 g | — | — | 4.9 g | 0.2 g | 0.2 g | 6.7 g | — | 81 g |
| Example 2 | 7.4 g | 1.9 g | 0.2 g | — | — | 4.9 g | 0.2 g | 0.2 g | 4.2 g | — | 81 g |
| Example 3 | 5 g | 5.4 g | 0.2 g | — | — | 3.9 g | 0.2 g | 0.2 g | 4.1 g | — | 81 g |
| Example 4 | 1.9 g | 2.8 g | 0.2 g | — | — | 6.9 g | 0.2 g | 0.2 g | 6.8 g | — | 81 g |
| Example 5 | 4 g | 2.8 g | — | 0.2 g | — | 4.9 g | 0.2 g | 0.2 g | 6.7 g | — | 81 g |
| Example 6 | 4 g | 2.8 g | — | — | 0.2 g | 4.9 g | 0.2 g | 0.2 g | 6.7 g | — | 81 g |
| Example 7 | 4 g | 2.8 g | 0.2 g | — | — | 4.9 g | 0.2 g | 0.2 g | 6.2 g | 0.5 g | 81 g |
| Comparative Example 1 | — | 6.8 g | 0.2 g | — | — | 4.9 g | 0.2 g | 0.2 g | 6.7 g | — | 81 g |
| Comparative Example 2 | 6.8 g | — | 0.2 g | — | — | 4.9 g | 0.2 g | 0.2 g | 6.7 g | — | 81 g |
| Comparative Example 3 | 4 g | 3 g | — | — | — | 4.9 g | 0.2 g | 0.2 g | 6.7 g | — | 81 g |

After dispersion was finished, beads and a dispersed solution were separated using a filter to prepare a colored dispersion having a solid content of 23 wt %.

Preparation Example 7: Preparation of Organic Colored Dispersion (F-2) (Organic Black Dispersion)

The colored dispersion (F-2) was supplied from Tokushiki Co., which was prepared by the following method;

8 g of an acrylic copolymer solution (Tokushiki Co.) having a weight average molecular weight of 12,000 to 20,000 g/mol and an acid value of 80 to 150 mgKOH/g, 8 g of an acrylic polymer dispersion (Tokushiki Co.) having an amine value of 100 to 140 mgKOH/g, 80 g of lactam black (Black 582, BASF) as organic black, and 384 g of PGMEA as a solvent were dispersed using a paint shaker at 25° C. for 6 hours. The dispersion was carried out using 0.3 mm zirconia beads. After dispersion was finished, beads and a dispersed solution were separated using a filter to prepare a colored dispersion having a solid content of 23 wt %.

Experimental Example 1: Measurement of Physical Properties of Cured Film Manufactured from Black Photosensitive Resin Composition Each of the black photosensitive resin compositions prepared in the examples and the comparative examples was coated on a glass substrate using a spin coater, and was pre-baked at 100° C. for 100 seconds to form a coating film. On the coating film thus manufactured, a pattern mask of a 100% full-tone (F/T) column spacer (CS) and a pattern mask of a 30% half-tone (H/T) column spacer (CS) were applied, respectively, and a light having a wavelength of 365 nm was irradiated with the intensity of 42 mJ/cm$^2$ with the gap of 150 μm between the cured film and the mask. After checking break point (BP) time, the coating film was developed at 23° C. for 15 seconds using a diluted aqueous solution having 0.04 wt % of potassium hydroxide, and washed with pure water for 1 minute. The pattern thus formed was post-baked at 230° C. for 30 minutes in an oven to obtain a cured film.

(1) Evaluation of Coatability 3 g of the black photosensitive resin composition was dropped and spin coated on a glass substrate having a size of 10 cm×10 cm to evaluate coatability. A uniform coating film without Bernard cells or interference stripes was evaluated as good (○).

(2) Measurement of Thickness of Black Column Spacer

After obtaining a main column spacer (Main CS) and a sub column spacer (Sub CS) according to the above manufacturing method of a cured film (see FIG. 1), each of thickness A and thickness B was measured using a height difference measuring apparatus (SNU(SIS-2000), SNU Precision). When thickness difference A-B is 0.3 to 0.5 μm, good height difference property may be expected.

(3) Evaluation of Adhesion

Pursuant to the manufacturing method of a cured film, an exposure intensity for reproducing a constant dot pattern using a 30% H/T pattern mask with a diameter of 20 μm was obtained, and a pattern capable of being developed was checked. If a dot pattern had a minimum pattern size of 10 μm or less and was not exfoliated after immersing the pattern in 100% N-methyl pyrrolidone (NMP) solution at 80° C. for 10 minutes, the adhesion was evaluated as ○. On the other hand, if a dot pattern had a size greater than 10 μm or was exfoliated after immersing the pattern in an NMP solution at 80° C. for 10 minutes, the adhesion was evaluated as x.

(4) Evaluation of Surface Properties of Black Matrix

After forming Main CS and Sub CS pursuant to the manufacturing method of a cured film, each surface was observed using a scanning electron microscope (SEM, S-4300, Hitachi). If surface particles were found to be aggregated, the surface properties were evaluated as bad (x), and if surface particles were found to be smooth, the surface properties were evaluated as good (○).

(5) Measurement of Optical Density

The manufacture of a cured film was carried out without using a mask, to form a cured film having a thickness of 3.0 μm after post-baking. With respect to the cured film, transmittance at 550 nm was measured using an optical density system (361T, Xlite), and optical density with respect to a thickness of 1 μm was obtained.

TABLE 2

| | Coatability | Height difference (μm) | Adhesion | Surface roughness | Optical density/μm |
|---|---|---|---|---|---|
| Example 1 | ○ | 0.48 | ○ | ○ | 1.84 |
| Example 2 | ○ | 0.45 | ○ | ○ | 1.16 |
| Example 3 | ○ | 0.38 | ○ | ○ | 1.12 |
| Example 4 | ○ | 0.42 | ○ | ○ | 1.89 |
| Example 5 | ○ | 0.48 | ○ | ○ | 1.84 |
| Example 6 | ○ | 0.43 | ○ | ○ | 1.84 |
| Example 7 | ○ | 0.42 | ○ | ○ | 1.80 |
| Comparative Example 1 | ○ | 0.1 | ○ | x | 1.84 |
| Comparative Example 2 | ○ | 0.6 | ○ | x | 1.84 |
| Comparative Example 3 | ○ | 0.35 | x | x | 1.84 |

As shown in Table 2, the cured films (Main CS and Sub CS) manufactured from the black photosensitive resin compositions of Examples 1 to 7 had good coatability, height difference, adhesion to a substrate, surface roughness and optical density.

Particularly, the cured films of the examples showed height difference of 0.3 to 0.5 μm, and good surface roughness, coatability and adhesion. Accordingly, both pattern forming properties and developability were good.

On the contrary, the cured films manufactured from the photosensitive resin compositions of Comparative Examples 1 to 3, which do not contain any one of a copolymer, an epoxy resin or a compound derived therefrom and an epoxy compound had poor surface roughness.

Further, Comparative Examples 1 and 2 had inferior height difference properties, and Comparative Example 3 exhibited inferior adhesion to a substrate.

Accordingly, the black photosensitive resin composition according to the present invention can be effectively used as a black column spacer in various electronic devices such as an LCD and OLED display.

The invention claimed is:

1. A black photosensitive resin composition, comprising:
   (A) an acrylic copolymer;
   (B) an epoxy resin or a compound derived therefrom;
   (C) an epoxy compound different from (A) and (B);
   (D) a photopolymerizable compound;
   (E) a photoinitiator; and
   (F) a black colorant;
   wherein, the acrylic copolymer (A) is comprised in an amount of 10 to 40 wt % on the basis of the total weight (based on solid content) of the black photosensitive resin composition, and the epoxy resin or the compound derived therefrom (B) is comprised in an amount of 10 to 40 wt % on the basis of the total weight (based on solid content) of the black photosensitive resin composition,
   wherein the weight ratio of acrylic copolymer (A):epoxy resin or compound derived therefrom (B) is 40 to 80:60 to 20,
   wherein the black colorant (F) comprises 90 wt % or more of a black inorganic colorant on the basis of the total weight (based on solid content) of the colorant, and
   wherein the black photosensitive resin composition has an optical density of 0.5 to 2.5 when the black photosensitive resin composition is cured to a film having a thickness of 1 μm.

2. The black photosensitive resin composition of claim 1, wherein the black colorant (F) is comprised in an amount of 10 to 60 wt % based on the total weight (based on solid content) of the black photosensitive resin composition.

3. The black photosensitive resin composition of claim 2, wherein the black colorant (F) comprises 0 to 10 wt % of a black organic colorant on the basis of the total weight (based on solid content) of the colorant.

4. The black photosensitive resin composition of claim 1, wherein the epoxy resin or the compound derived therefrom (B) has a cado backbone structure.

5. The black photosensitive resin composition of claim 1, wherein the epoxy compound (C) is a homopolymer or copolymer having a structural unit derived from a monomer having an epoxy group and an unsaturated double bond.

* * * * *